United States Patent
Shibutani et al.

(10) Patent No.: US 6,453,249 B1
(45) Date of Patent: Sep. 17, 2002

(54) APPARATUS FOR JUDGING DETERIORATION OF BATTERY

(75) Inventors: Atsushi Shibutani; Shinji Kato, both of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,762

(22) Filed: Jan. 27, 2000

(30) Foreign Application Priority Data

Jan. 28, 1999 (JP) .......................................... 11-020793

(51) Int. Cl.$^7$ ................................................. H02J 7/00
(52) U.S. Cl. ......................................... 702/63; 320/132
(58) Field of Search ........................... 702/63; 320/132, 320/43; 318/139

(56) References Cited

U.S. PATENT DOCUMENTS

| | | | | |
|---|---|---|---|---|
| 5,808,428 A | * | 9/1998 | Ito et al. ..................... | 318/139 |
| 6,252,377 B1 | * | 6/2001 | Shibutani et al. ........... | 320/132 |
| 6,294,843 B1 | * | 9/2001 | Kato et al. .................. | 180/65.2 |

* cited by examiner

Primary Examiner—Kamini Shah
(74) Attorney, Agent, or Firm—Arent Fox Kintner Plotkin & Kahn

(57) ABSTRACT

The apparatus for judging deterioration of a battery, of the present invention, comprises: a current detector for detecting output electric current from and regenerative electric current to the battery; a voltage detector for detecting a voltage output from the battery; an integrator for calculating the remaining charge in the battery by integrating the result of detection by the current detector; a threshold voltage calculator for calculating threshold voltage values corresponding to first and second specified values of the remaining charge, based on the electric current value filtered by the filter; a comparator for comparing the threshold voltage value, calculated by the threshold voltage calculator, with the output voltage value from the battery; a corrector for correcting the remaining charge to the first or second specified value when the output voltage value has reached the threshold voltage value; a current integrator for integrating the output current from the battery and the regenerative current after the remaining charge was corrected to the first specified value until the remaining charge is corrected to the second specified value; and a deterioration judgement device for judging the deterioration of the battery when the value obtained from the integration by the current integrator is equal to or below a predetermined deterioration criterion.

2 Claims, 12 Drawing Sheets

REMAINING CHARGE OF BATTERY

APPARATUS FOR JUDGING DETERIORATION OF BATTERY

BACKGROUND OF THE INVENTION

1. Field of the Invention

The present invention relates to an apparatus for judging the deterioration of a battery, and in particular, to an apparatus for judging whether the battery, especially for a vehicle, is deteriorating or not.

This application is based on Japanese Patent Application No. Hei 11-20793, the contents of which are incorporated herein by reference.

2. Description of the Related Art

In recent years, electric vehicles and hybrid vehicles have been developed in order to reduce the discharge of carbon dioxide, in consideration of the global warming effect. These vehicles have a motor which does not discharge any gas, and a battery for supplying electric energy.

The electric vehicle is continuously driven by the motor. The hybrid vehicle utilizes the motor to assist the engine, and is often driven only by the motor.

Accurately detecting the remaining charge in the battery that supplies energy to the vehicle is important for determining whether to start charging or not, and to detect the remaining available time and the life of the battery.

FIGS. 13A and 13B are diagrams for explaining the deterioration of a battery.

FIG. 13A shows the initial capacity of the battery, and the hatched area represents the capacity. As the battery deteriorates, the capacity of the battery decreases as shown in FIG. 13B, and therefore the maximum chargeable energy decreases even when the battery is charged for many hours.

A method for judging the deterioration of the battery based on a comparison with the maximum chargeable capacity is proposed. In this method, the battery is fully charged by a charger, and the charging current is integrated so that remaining charge in the full charge state is calculated. This remaining charge in the full charge state is divided by the initial remaining charge. When the obtained value is below a predetermined value, it is judged that the battery has deteriorated. The details of this method for judging the battery deterioration are disclosed in, for example, Japanese Patent Application, Unexamined First Publication No. Hei 5-284607.

Generally, the batteries on hybrid vehicles are not charged by external chargers (commercial electric power sources), and are charged by electric power generation by a regenerative brake when the vehicles decelerate. Therefore, the battery cannot be fully charged, and the judging of the battery deterioration by the above method may be inaccurate.

Further, a conventional method detects the remaining charge in the battery by time-integrating a charging current to the battery and a discharging current from the battery to the motor. The remaining charge basically corresponds to the total of charge stored in the battery. The total of the supplied and released electrical charge can be calculated by the time-integration of the electric current value (the charging current is positive, and the discharging current is negative). The details of this method can be understood from Japanese Patent Application, First Publication No. Hei 63-208773.

In general, the conventional electric current detector necessarily incurs an error. When the electric current is momentarily measured, the error may be permissible. However, in the time-integration of the electric current, the errors are also integrated so that the discrepancy increases as time passes. This discrepancy is not permissible in the time integration because it reduces the detection accuracy. Therefore, when the battery deterioration is judged based on this time integration value which includes the permissible errors, the accuracy in the judgement may be insufficient.

Further, the batteries on hybrid vehicles are charged not by the external chargers but by the regenerated current, that is, the current generated by the motor rotated by the engine. Therefore, the battery on the hybrid vehicle may not be fully charged, and the method disclosed in Japanese Patent Application, First Publication No. Hei 63-208773, cannot accurately judge the deterioration of the battery.

BRIEF SUMMARY OF THE INVENTION

It is therefore an object of the present invention to provide an apparatus for judging of deterioration of a battery, which can accurately judge the deterioration of the battery even when the battery is frequently and transiently used.

In order to accomplish the above object, the apparatus for judging of deterioration of a battery, comprises: a current detector (30, 40) for detecting output electric current from and regenerative electric current to the battery; a voltage detector (44) for detecting a voltage output from the battery; an integrator (54) for calculating the remaining charge in the battery by integrating the result of detection by the current detector; a threshold voltage calculator (56) for calculating threshold voltage values corresponding to first and second specified values of the remaining charge, based on the electric current value filtered by the filter; a comparator (58) for comparing the threshold voltage value, calculated by the threshold voltage calculator, with the output voltage value from the battery; a corrector (60) for correcting the remaining charge to the first or second specified value when the output voltage value has reached the threshold voltage value; a current integrator (54, S612) for integrating the output current from the battery and the regenerative current after the remaining charge was corrected to the first specified value until the remaining charge is corrected to the second specified value; and a deterioration judgement device (62) for judging the deterioration of the battery when the value obtained from the integration by the current integrator is equal to or below a predetermined deterioration criterion.

In this invention, the current integrator integrates the output current from the battery and the regenerative current after the remaining charge was corrected to the first specified value until the remaining charge is corrected to the second specified value. The deterioration judgement device judges the deterioration of the battery when the value obtained from the integration by the current integrator is equal to or below a predetermined deterioration criterion. Therefore, the accuracy in the judgement is improved.

In another aspect of the invention, the apparatus further comprises: a temperature detector (42) for detecting the temperature of the battery; and a battery deterioration judgement prohibition device (64) for prohibiting the judgement of the deterioration of the battery when the temperature detected by the temperature detector is below a preset temperature, when the time for the integration by the current integrator is longer than a predetermined time, or when the charging/discharging current is above a charging/discharging threshold value.

Even when the battery temperature is low, when the charging/discharging current is high, or when the measured time is long, mis-judgements can be avoided.

DETAILED DESCRIPTION OF THE INVENTION

The embodiment of the apparatus for judging deterioration of a battery according to the present invention will be explained with reference to figures.

Figure 1:
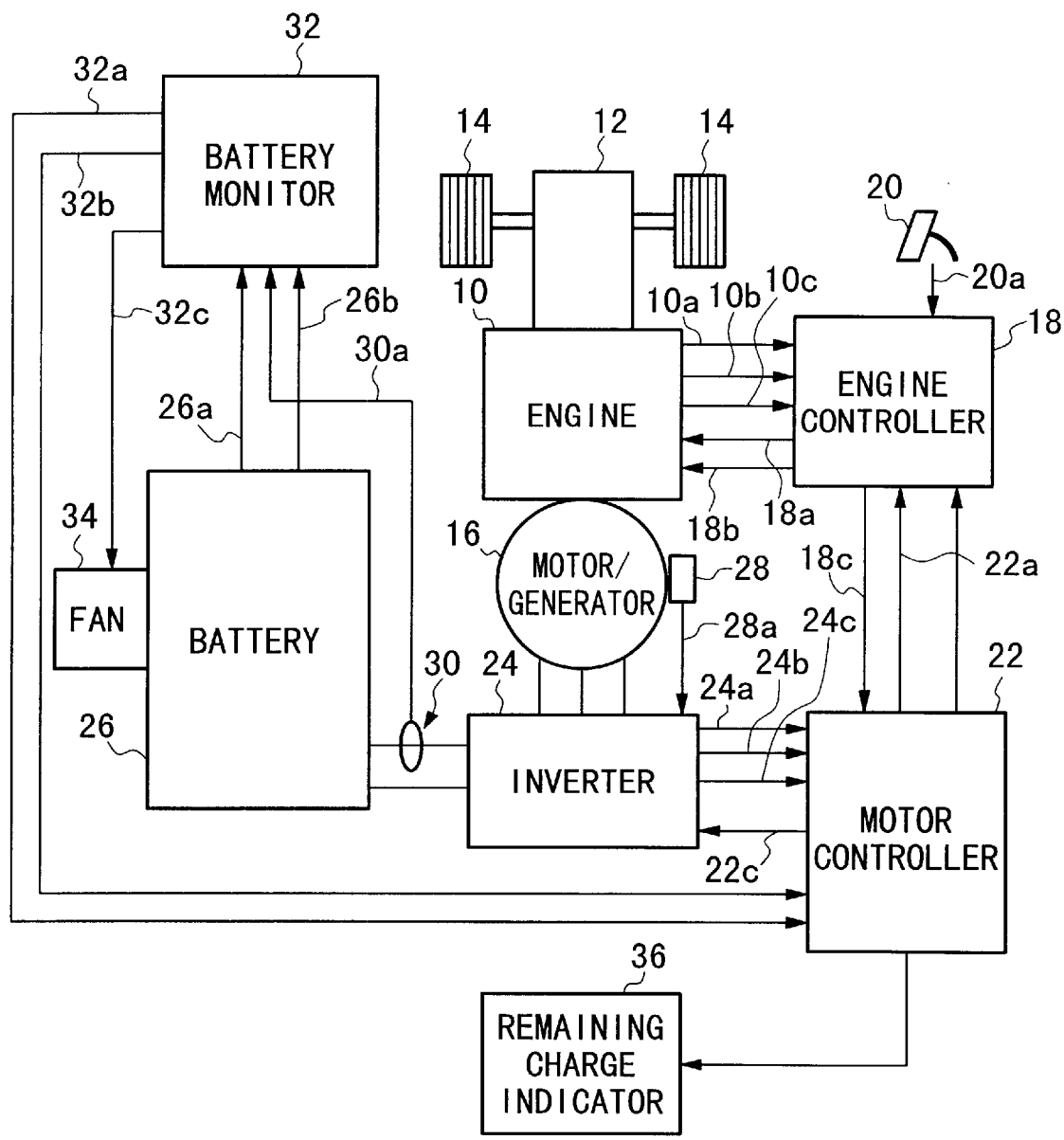
FIG. 1 is a block diagram showing the entire structure of the vehicle using the apparatus for judging the deterioration of a battery of the present invention.

FIG. 1 is a block diagram showing the entire structure of a vehicle using the apparatus for judging the deterioration of a battery of the present invention. In this embodiment, the present invention is applied to the hybrid vehicle.

In FIG. 1, reference numeral 10 denotes an engine, from which a driving force is transmitted via a transmission 12 to wheels 14. A motor/generator 16 driven by a three-phase alternating current is provided in parallel with the engine 10. The rotational shaft of the motor/generator 16 is directly connected with the rotational shaft of the engine 10. When the engine 10 is stopped, the driving force from the motor/generator 16 is transmitted via the transmission 12 to the wheels 14. When the engine 10 is driven, the engine 10 rotates the motor/generator 16, which therefore acts as a generator.

Reference numeral 18 denotes an engine controller which receives signals indicating the engine rotational speed Ne, an air intake passage pressure Pb, and water temperature Tw, via signal lines 10a, 10b, and 10c from the engine 10, and which receives a signal $\theta_{Th}$ indicating the angle of depression or inclination of an accelerator pedal 20 through a signal line 20a. Based on these signals, the engine controller 18 calculates an amount of fuel to be supplied to the engine, and ignition timing, and outputs signals for controlling the fuel amount and the ignition timing through signal lines 18a and 18b.

Further, the engine controller 18 controls the operation of the motor/generator 16. The engine controller 18 is connected to a motor controller 22 through signal lines 18c and 22a. The engine controller 18 outputs a control signal to the motor controller 22 through the signal line 18c, regulate the output power of the motor/generator 16. The motor controller 22 outputs the remaining charge in the battery 26 to the engine controller 18 through the signal line 22a. The engine controller 18 calculates the driving force or the regenerative force by the motor/generator 16, based on the remaining charge in the battery 26 and the driving condition of the engine 10 (e.g., the depression of the accelerator, or the engine rotational speed), and sends the result to the motor controller 22 through the signal line 18c.

Reference numeral 24 denotes an inverter connected to the battery 26. Based on a control signal supplied from the motor controller 22 through a signal line 22c, the inverter 24 converts the electric power from the battery 26 into a three-phase alternating current at a predetermine value, and supplies it to the motor/generator 16. The motor/generator 16 has an angle detector 28, and the detected angle is input to the inverter 24 through a signal line 28a. The angle detector 28 is attached to the rotational shaft of the motor/generator 16, to detect the rotational angle of the shaft. The detected angle is sent from the inverter 24 to the motor controller 22 through a signal line 24a.

The inverter 24 detects a phase current and all electric currents flowing through the motor/generator 16, and output the detected electric currents to the motor controller 22 through the signal lines 24b and 24c. To produce the output power by the motor regulated by the control signal sent from the engine controller 18 through the signal line 18c, the motor controller 22 calculates the electric power to be supplied to the motor/generator 16, based on the rotation angle, phase current, and all electric currents input from the inverter 24 through the signal lines 24a, 24b, and 24c, and outputs the result through the signal line 22c as a control signal.

Between the battery 26 and the inverter 24, a current detector 30 for detecting the current output from the battery 26 is provided, and the detected value is output to a battery monitor 32 through a signal line 30a.

The battery 26 comprises ten sub-batteries connected together in serial, and each sub-battery has a voltage detector and a temperature detector (not shown), from which the detected voltage and temperature are output to the battery monitor 32 through signal lines 26a and 26b.

The battery monitor 32 monitors the condition of the battery 26, e.g., the remaining charge and the temperature, outputs the remaining charge in the battery 26 through the signal line 32a, and the voltage, which is output from the battery 26, to the motor controller 22. through a signal line 32b.

Further, based on the temperature of the sub-batteries input through the signal line 26b, the battery monitor 32 controls the temperature of the battery 26 by outputting a driving control signal for controlling a fan 34 through a signal line 32c.

Reference numeral 36 denotes a remaining charge indicator for indicating the remaining charge in the battery 26, which is attached to, e.g., a display panel of a driver's seat to indicate the remaining charge to a driver.

The entire operation of the vehicle with the apparatus for judging the remaining charge of battery will be explained below.

Initially, the operation is described when the vehicle is driven by the engine 10.

As a driver depresses the accelerator pedal 20, the signal $\theta_{Th}$ indicating the depressing angle of an accelerator pedal 20 is input to the engine controller 18 through the signal line 20a. On reception of the signal $\theta_{Th}$, the engine controller 18 outputs the signal, which controls the fuel supplied to the engine, through the signal line 18a to the engine 10, and simultaneously outputs the signal, which controls the ignition timing, through the signal line 18b to the engine 10.

Based on these signals, the engine 10 injects a specified amount of fuel into the cylinders, and ignites gas at a specified timing. The driving force from the engine 10 is transmitted via the transmission 12 to the wheels 14 to drive the vehicle. While driving the vehicle using the engine 10, the signals indicating the engine rotational speed, the air intake passage pressure, and the water temperature are output from the engine 10 through the signal lines 10a, 10b, and 10c to the engine controller 18. Based on these signals and on the signal $\theta_{Th}$ indicating the depression angle of the accelerator pedal 20, the engine controller 18 outputs the control signal for the engine 10 through the signal lines 18a and 18b.

As described above, because the rotational shaft of the engine 10 is directly connected to the rotational shaft of the motor/generator 16, the motor/generator 16 generates electric energy by the rotation of the engine 10. The electric energy from the motor/generator 16 is supplied via the inverter 24 to the battery 26, thereby charging the battery 26.

While the battery 26 is being charged, the current detector 30 detects the current flowing from the inverter 24 to the battery 26, and outputs the detected current value through the signal line 30a to the battery monitor 32.

Next, the operation will be explained when the motor/generator 16 drives the vehicle.

As the driver depresses the accelerator pedal 20, the signal $\theta_{Th}$ indicating the depressing angle of an accelerator pedal 20 is input to engine controller 18 through the signal line 20a. On reception of the signal $\theta_{Th}$, the engine controller 18 outputs the control signal, corresponding to the signal $\theta Th$ indicating the angle of depression or inclination of the accelerator pedal 20, through the signal line 18c, when the remaining charge in the battery 26 input through the signal line 22a is equal to or above a predetermined value.

Based on the control signal input through the signal line 18c, the motor controller 22 outputs the control signal to the inverter 24 through the signal line 22c. On reception of the control signal, the inverter 24 converts the current, supplied from the battery 26, into the three-phase alternating current corresponding to the input control signal, and supplies it to the motor/generator 16. Thus, the motor/generator 16 is rotated, and this driving force is transmitted via the transmission 12 to the wheels 14 to start the vehicle.

After the start of the rotation of the motor/generator 16, the angle detector 28 outputs the detected angle to the inverter 24, which then outputs the detected angle, phase current, and all currents to the motor controller 22. To produce the output power by the motor regulated by the control signal sent from the engine controller 18 through the signal line 18c, the motor controller 22 calculates the electric power to be supplied to the motor/generator 16, based on the signals from the inverter 24, and outputs the result through the signal line 22c as the control signal. The inverter 24 converts the electric power, supplied from the battery 26, into the three-phase alternating current at a value corresponding to the control signal, and supplies it to the motor/generator 16.

When the vehicle is driven by the engine 10 or the motor/generator 16, the current detected by the current detector 30 and the voltage and temperature output from the battery 26 are input to the battery monitor 32. Based on these detected values, the battery monitor 32 adjusts the temperature of the battery 26 by controlling the fan 34, calculates the remaining charge in the battery 26, and outputs the calculated remaining charge to the motor controller 22 through the signal line 32a. The remaining charge, output to the motor controller 22, is output also to the engine controller 18 and to the remaining charge indicator 36.

When the remaining charge in the battery 26 is low, the engine controller 18 forcibly switches the vehicle to the drive mode using the engine 10. Based on the indication by the remaining charge indicator 36, the driver may switch the vehicle to the drive mode using only the engine 10.

The apparatus for judging the deterioration of the battery of the present invention will be explained in detail.

Figure 2:
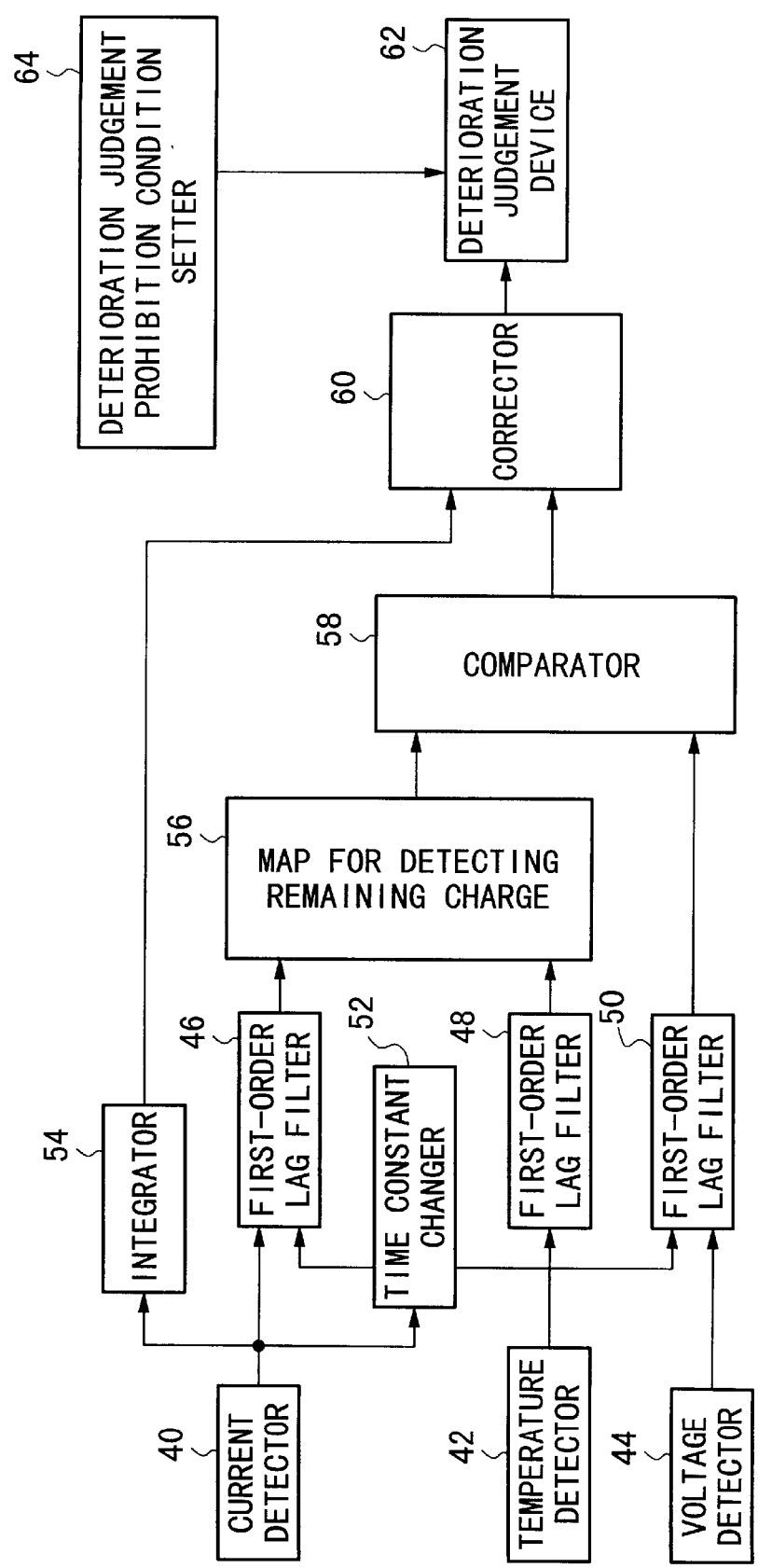
FIG. 2 is a block diagram showing the structure of the apparatus for judging the deterioration of the battery of the present invention.

FIG. 2 is a block diagram showing the apparatus for judging the deterioration of the battery.

The apparatus for judging the deterioration of the battery shown in FIG. 2 is provided in the battery monitor 32 in FIG. 1. The embodiment of the apparatus for judging the deterioration of the battery is achieved by a general computer with a CPU (Central Processing Unit), a RAM (Random Access Memory), and a ROM (Read Only Memory), which are not shown. The following process is provided by a CPU that reads and performs programs from the ROM.

In FIG. 2, reference numeral 40 denotes a current detector corresponding to the current detector 30 in FIG. 1. Reference numeral 42 denotes a temperature detector, and 44 denotes a voltage detector, which correspond to the temperature detectors and the voltage detectors in the sub-batteries described above. The results of the detection by the current detector 40, the temperature detector 42, and the voltage detector 44 are input to first-order lag filters 46, 48, and 50. The first-order lag filters 46, 48, and 50 are the so-called low-pass filters. The signals, which are input to the first-order lag filters 46, 48, and 50, are digitized by sampling and quantizing the values detected by the current detector 40, the temperature detector 42, and the voltage detector 44. The first-order lag filter 48 for the temperature detector 42 eliminates noise (electric noise) from the detected value, and has no influence on the response characteristics of the battery 26. Therefore, the first-order lag filter 48 may be omitted.

The most simple structure for the low-pass filter using an electric circuit is comprised of a condenser and a resistor, while in this embodiment the first-order lag filters 46, 48, and 50 are provided by software. That is, when the preceding output from the first-order lag filter 46, 48, or 50 is Dn−1, and the present output is Dn, and the present detected value is D, the functions of the first-order lag filters 46, 48, and 50 are expressed by the following equation:

$$Dn = \tau_1 D_{n-1} + \tau_2 D,$$

where, $\tau_1$ and $\tau_2$ are variables for determining a time constant of the first-order lag filter 46, 48, or 50. The relationship between the variables is expressed by $\tau_1 + \tau_2 = 1$. From the characteristics of the first-order lag filters 46, 48, and 50, as the variable $\tau_2$ is increased, the effect on the present output Dn given by the present detected value D is increased. In contrast, as the variable $\tau_2$ is decreased, the effect on the present output Dn given by the present detected value D is decreased.

Accordingly, as the variable $\tau_2$ is increased, the variable of the first-order lag filter 46, 48, or 50 is decreased, while, as the variable $\tau_2$ is decreased, the variable of the first-order lag filter 46, 48, or 50 is increased. In other words, as the variable $\tau_1$ is increased, the variable of the first-order lag filter 46, 48, or 50 is increased, while, as the variable $\tau_1$ is decreased, the variable of the first-order lag filter 46, 48, or 50 is decreased.

Examples of the variables $\tau_1$ and $\tau_2$ are shown in the following equation:

$$Dn=0.95D_{n-1}+0.05D$$

Returning to FIG. 2, reference numeral 52 denotes a time constant changer, which changes the time constants of the first-order lag filters 46 and 50, depending on the output from the current detector 40.

Reference numeral 54 denotes an integrator (current integrator), which integrates the result of the detection by the current detector 40, integrates the current output from the battery 26 in FIG. 1 and the regenerative current from the battery 26, to thereby calculate the remaining charge in the battery 26. The charging of the battery 26 is not always proportional to the current flowing into the battery 26, that is, the charging efficiency changes depending on the temperature and the remaining charge in the battery 26. Therefore, a map indicating the relationship between the temperature, the remaining charge in the battery 26, and the charging efficiency is prepared beforehand. The charging efficiency $\eta$ is obtained from the temperature and the remaining charge in the battery 26. Based on the charging efficiency $\eta$ and the current flowing into the battery 26, the remaining charge in the battery 26 is calculated.

Reference numeral 56 denotes a map for detecting the remaining charge (threshold voltage calculator). According to the map which indicates the relationship between the battery temperature, the battery output, and the battery output voltage, when the remaining charge of the sub-batteries of the battery 26 reaches a predetermined value (e.g., 80% or 20%), a voltage (upper limit voltage, threshold voltage) corresponding to the remaining charge of 80% and a voltage (lower limit voltage, threshold voltage) corresponding to the remaining charge of 20% are obtained from the electric current value output from the first-order lag filter 46 and from the temperature output from the first-order lag filter 48.

The map 56 for detecting the remaining charge will be explained in more detail.

The relationship between the remaining charge in the battery and the output electric current value will now be explained.

Figure 3:
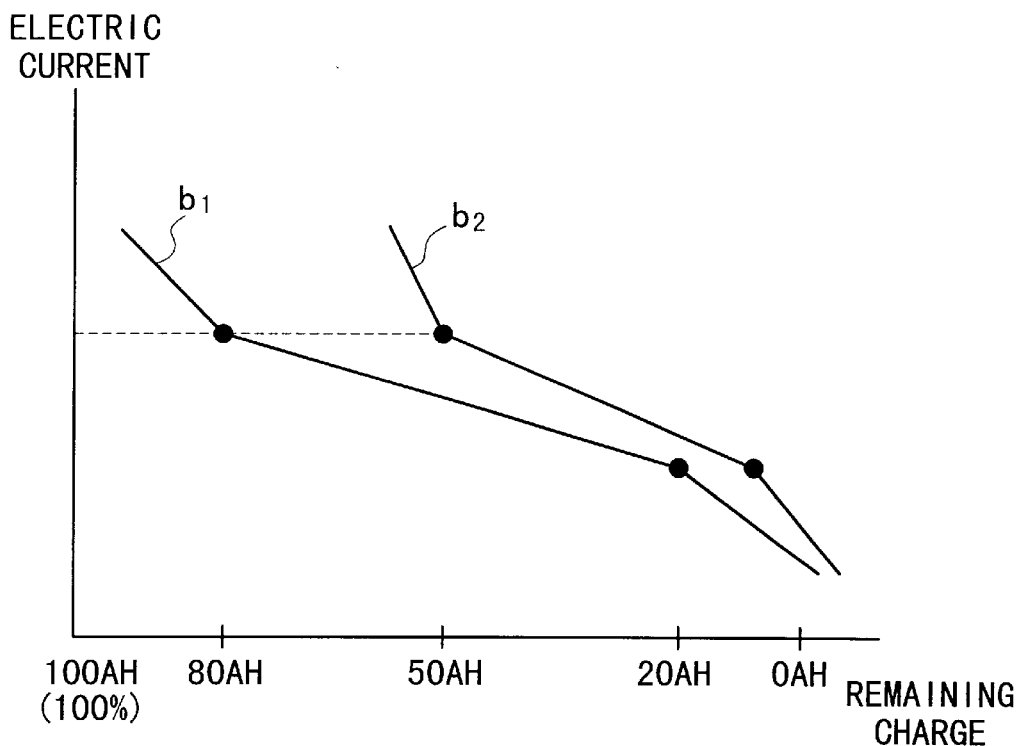
FIG. 3 is a diagram showing the relationship between the remaining charge in the battery and an output voltage value.

FIG. 3 shows an example indicating the relationship between the remaining charge in the battery and the output electric current value. In FIG. 3, the horizontal axis represents the remaining charge, and the unit is AH (Ampere Hour). The vertical axis represents the output electric current value, and the unit is arbitrary. In FIG. 3, the curve indicated by reference character b1 represents the relationship between the remaining charge in the battery and the output electric current value in the initial state of the battery. Between the remaining charge of 80% and 20%, the inclination of the curve b1 varies because of the inherent characteristics of the battery. The curve indicated by reference character b2 represents the relationship between the remaining charge and the electric current value when the battery deteriorates.

Generally, the battery is used in a range of the remaining charge of 20% to 80%. Therefore, when the battery is in the initial state, the remaining charge can be obtained from 80%−20%=60%. Although the deteriorated battery seemingly outputs the electric current at the same value as that output from the battery in the initial state, the deteriorated battery outputs the electric current when the remaining charge is 50%, and the available charge is at most 30 AH of the electric current. Thus, as the battery deteriorates, the available charge decreases.

Figure 4:
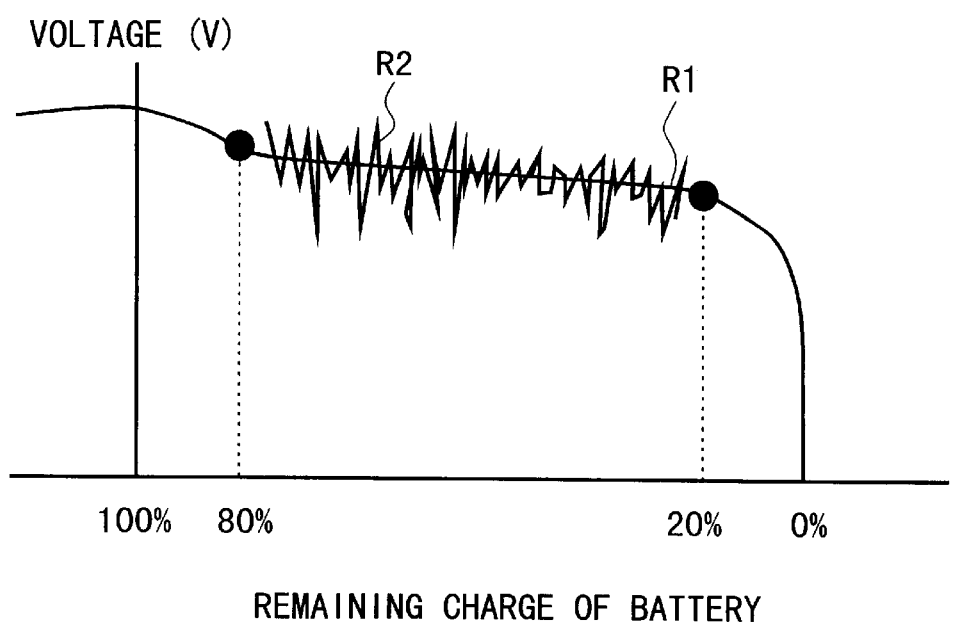
FIG. 4 is a diagram showing the example of the change in the voltage output from the battery.

FIG. 4 is a diagram showing the change in the voltage output from the battery. In this figure, the horizontal axis represents the remaining charge, while the vertical axis represents the voltage output from the battery.

As shown in FIG. 4, when the remaining charge is between the end stage of the discharging (the remaining charge is below 20%) and the end stage of the charging (the remaining charge is 80%), as the remaining charge decreases, the output voltage varies at a relatively small amount of the rate of change, which is indicated by the curve denoted by reference character R1. Because the hybrid vehicle repeats the charging and discharging of the battery, the actual voltage varies as shown in the line denoted by reference character R2. The small amount of the rate of change means that, because the rate of change slightly varies, the average of the rate of change is small.

When the remaining charge enters the end stage of the charging (the remaining charge becomes above 80%), the rate of change in the output voltage increases. When entering the end stage of discharging (the remaining charge falls below 20%), the rate of change similarly increases. Thus, the voltage output from the battery varies depending on the remaining charge, and especially varies significantly during the end stages of the charging and discharging (when the remaining charge is 80% or 20%).

Figure 5A:
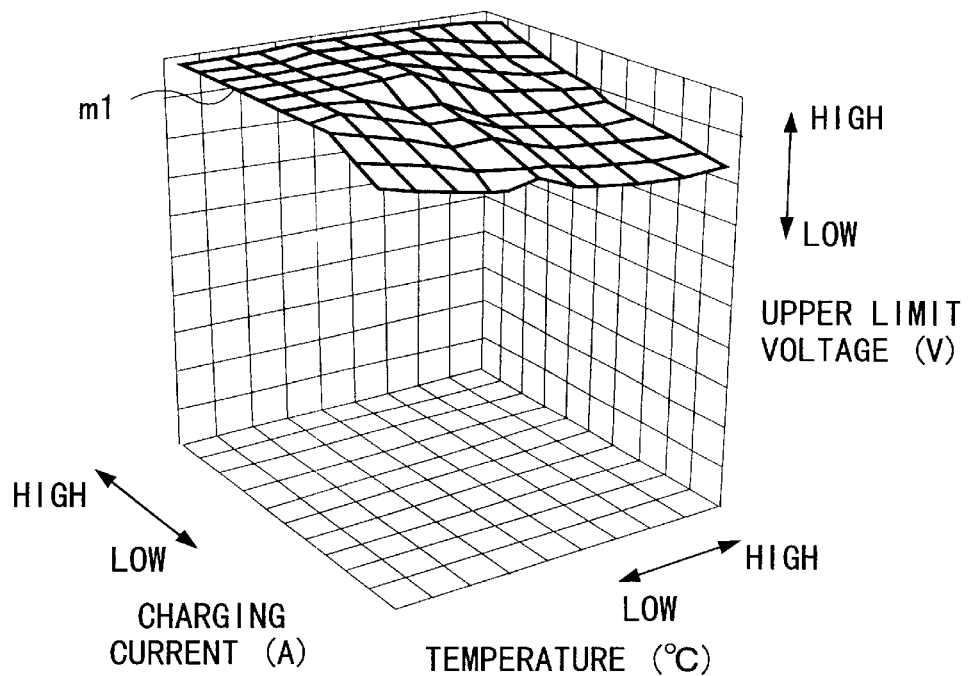
FIGS. 5A an 5B show maps of the present invention for correcting the remaining charge in the battery at the beginning of the end stage of the charging (when the remaining charge is 80%) and at the beginning of the end stage of discharging (when the remaining charge is 20%), based on the temperature of the battery, the electric current output from the battery, and the voltage output from the battery.
Figure 5B:
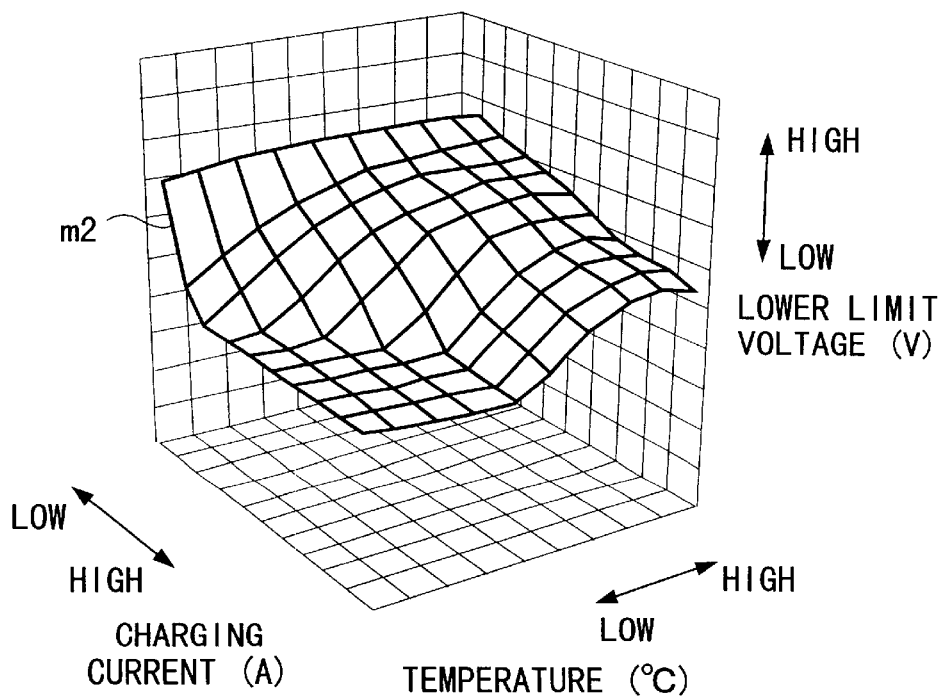

FIGS. 5A and 5B are diagrams showing maps for calculating the starting points of the end stage of charging (when the remaining charge is 80%) and of the end stage of discharging (when the remaining charge is 20%). The maps for correcting the remaining charge define the relationship between the battery temperature, the battery output electric current, and the battery output voltage. FIG. 5A shows the map for correcting the battery remaining charge, which defines the relationship between the battery temperature, the battery output voltage, and the battery output electric current when the remaining charge is 80%. FIG. 5B shows the map when the remaining charge is 20%.

In FIG. 5A, the surface indicated by reference character m1 corresponds to the map for correcting the battery remaining charge when the remaining charge is 80%, while the surface indicated by reference character m2 corresponds to the map for correcting the battery remaining charge when the remaining charge is 20%. If the battery remaining charge does not depend on the changes in the electric current and the temperature, the correction maps m1 and m2 are assumed to be flat. As shown in FIGS. 5A and 5B, because the correction maps m1 and m2 are not flat, the battery remaining charge clearly depends on the battery temperature, the output electric current, and the output voltage.

To measure the remaining charge based on the battery output voltage, the battery temperature, and the battery output electric current are initially measured. Then, from the measured temperature and output voltage, the actual output voltage corresponding to the remaining charge of 80% or 20%, is calculated. The output voltage (upper limit voltage) corresponding to the remaining charge of 80% is obtained from the correction map m1 in FIG. 5A, and the output voltage (lower limit voltage) corresponding to the remaining charge of 20% is obtained from the correction map m2 in FIG. 5B. The measured voltage output from the battery is compared with the upper or lower limit voltage. When the battery output voltage is above the upper limit voltage, it is judged that the battery is in the end stage of charging, while, when below the lower limit voltage, it is judged that the battery is in the end stage of discharging.

The battery 26, shown in FIG. 1, comprises ten sub-batteries, and each sub-battery has the voltage detector. In this embodiment, when at least one of the outputs from the sub-batteries is above the upper limit voltage, it is judged that the battery remaining charge is 80%. When at least one of the outputs from the sub-batteries is below the lower limit voltage, it is judged that the battery remaining charge is 20%.

A comparator 58 compares the voltage, output from the first-order lag filter 50, with the upper or lower limit voltage obtained from the map 56 for detecting the remaining charge, and determines whether the output voltage is above the upper limit voltage or below the lower limit voltage. The comparator 58 outputs the result when the output voltage is above the upper limit voltage or below the lower limit voltage.

A corrector 60 resets the value from the integrator 54, depending on the output from the comparator 58.

That is, the corrector 60 resets the value output from the integrator 54 when the comparator 58 outputs the signal indicating that the present voltage is equal to the voltage corresponding to the remaining charge of 80%, so as to set the present remaining charge in the battery 26 to 80%. Similarly, the corrector 60 resets the value output from the integrator 54 when the comparator 58 outputs the signal indicating that the present voltage is equal to the voltage corresponding to the remaining charge of 20%, so as to set the present remaining charge in the battery 26 to 20%. When the comparator 58 outputs the signal indicating that the present voltage is between the voltages corresponding to the remaining charge of 80% and 20%, the value output from the integrator 54 is set as the remaining charge.

Reference character 62 denotes a deterioration judgement device for judging, based on the remaining charge output from the corrector 60, whether the battery 26 is deteriorating or not. The process for judging the deterioration of the battery by the deterioration judgement device 60 will be explained in detail later. Reference character 64 denotes a deterioration judgement prohibition condition setter for setting conditions to prohibit the judgement of the deterioration. The conditions for prohibiting the judgement of the deterioration are whether charging/discharging is above a predetermined charging/discharging threshold value when the output voltage is between the upper and lower limit voltage values, whether the time required for the measured voltage to reach the upper or lower limit voltage value is longer than a preset time, and whether the battery temperature is below a preset temperature.

The reason why judging the deterioration is prohibited when the charging/discharging current is high or when the measured time is long is that, as the accuracy in integrating the charging/discharging current decreases, the accuracy in the judgement of the deterioration decreases. The reason why judging the deterioration is prohibited when the temperature of the battery is low is that the battery seemingly deteriorates when the battery temperature is low because the remaining charge decreases temporarily.

The operation of the embodiment of the apparatus for judging the deterioration of the battery will be explained with reference to FIGS. 6 to 12.

Figure 6:
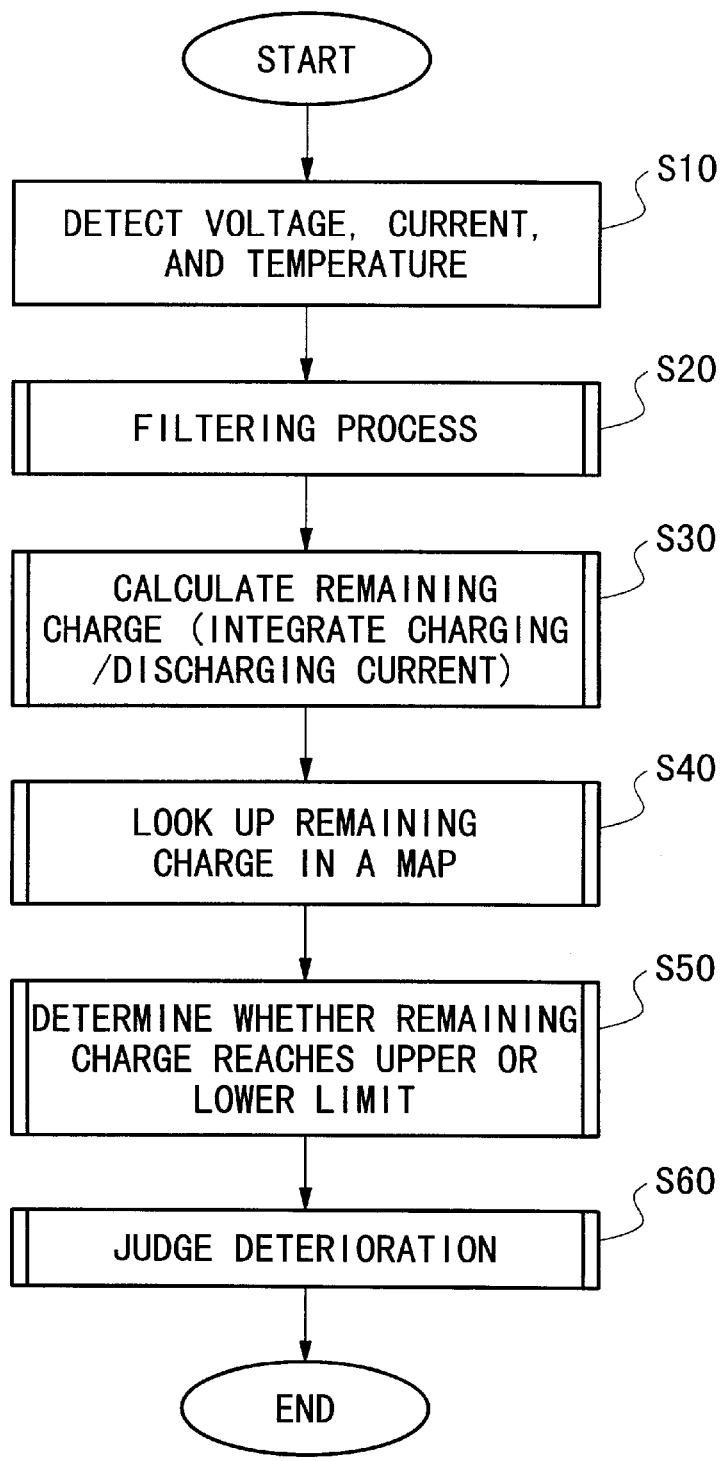
FIG. 6 is a flowchart showing the main routine in the operation of the apparatus for judging the deterioration of the battery of the present invention.

FIG. 6 is a flowchart showing the main routine in the operation of the apparatus for judging the deterioration of the battery.

Steps in the flowchart are performed at a predetermined interval. The interval between steps will be mentioned below.

When the driver starts the vehicle shown in FIG. 1, the apparatus for judging the deterioration of the battery also starts processing.

After the start of the judgement of the battery deterioration, the current detector 40 detects the electric current which flows between the battery 26 and the inverter 24, the temperature detector 42 detects the temperature of the sub-battery of the battery 26, and the voltage detector 44 detects the voltage output from the sub-battery (step S10). This step is repeated at an interval of 10 msec. Therefore, the detected values are sampled at the interval of 10 msec. Because this embodiment includes ten sub-batteries, there are ten pairs of signals of the voltages from the sub-batteries and of the temperatures of the sub-batteries.

The electric current value detected by the current detector 40 is input to the integrator 54, the time constant changer 52, and the first-order lag filter 46. The integrator 54 integrates the input electric current. Since the integrated electric current provided by the integrator 54 corresponds to the total electric charge which is charged to and discharged from the battery 26, the remaining charge is obtained from the integrated value.

The electric current detected by the current detector 40 is input to the first-order lag filter 46, and is simultaneously input to the time constant changer 52, where the filter process is performed. Similarly, the first-order lag filters 48 and 50 perform the filter processes (step S20). These processes are repeated at an interval of 10 msec.

The filter process in step S20 will now be explained.

Figure 7:
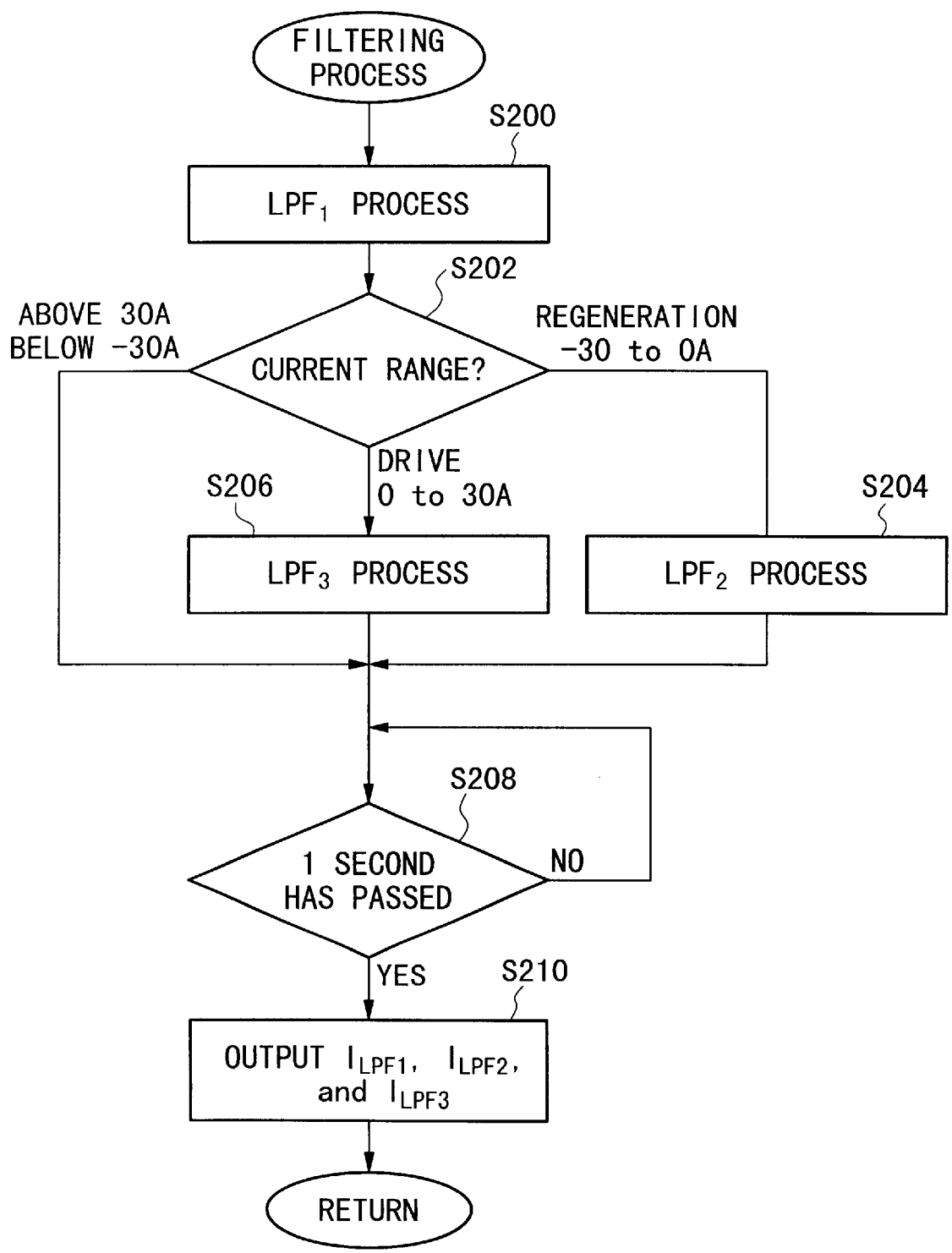
FIG. 7 is a flowchart showing a filtering process of the present invention.

FIG. 7 is a flowchart showing the procedure of the filter process. FIG. 7 shows the filter process performed in the first-order lag filter 42. Similar processes are performed by the other first-order lag filters 48 and 50.

Once the filter process has commenced, the filter process is performed using a first filter $LPF_1$ (time constant: 1 sec.) (step S200). The electric current value obtained by the first filter LPF1 is indicated by $I_{LPF1}$. Then, the electric current value (electric current range) is measured (step S202). This process is required to properly set the time constant depending on the detected electric current value. When in step S202 the detected electric current value is in the range of −30 to 0 A, the flow proceeds to step S204. In step S204, the filter process using a second filter (time constant: 20 sec.). The electric current value obtained by the filter process using the second filter $LPF_2$ is indicated by $I_{LPF2}$. As described above, the time constant for the first filter $LPF_1$ is 1 sec., and the time constant for the second and third filters $LPF_2$ and $LPF_3$ is 20 sec.

When in step S202 the electric current value is within the range of 0 to 30 A, the filter process using the third filter $LPF_3$ (time constant: 20 sec.) is performed (step S206). The electric current value obtained by the third filter $LPF_3$ is indicated by $I_{LPF3}$.

The second filter $LPF_2$ is used when charging the battery 26, and has the time constant for relatively low electric current value, while the third filter $LPF_3$ is used when the battery 26 discharges energy, and has the time constant for the relatively low electric current value.

While in the embodiment the time constants of the second and third filter $LPF_2$ and $LPF_3$ are the same, the time constants may be different.

When in steps S204, S206, and S202, the electric current is below −30 A or above 30 A, the flow proceeds to step S208.

In the above process, the filtered electric current is obtained. When the electric current value is within the range of −30 to 30 A, the electric current values $I_{LPF1}$ and $I_{LPF2}$, or $I_{LPF1}$ and $I_{LPF3}$ are obtained. Although it seems from FIG. 2 that the time constant changer 52 changes the time constants of the first-order lag filter 46 depending on the electric current value output from the current detector 40, this embodiment performs the filter process with the first filter $LPF_1$ and either the second filter $LPF_2$ or the third filter $LPF_3$, which have different time constants, and then selects one of the electric current values $I_{LPF1}$, $I_{LPF2}$, and $I_{LPF3}$ based on the electric current value, in order to accelerate the process and simplify the structure.

In addition, when the electric current is below −30 A or above 30 A, the electric current values $I_{LPF2}$ and $I_{LPF3}$ are not provided.

Returning to FIG. 7, it is determined in step S208 whether 1 sec. has passed after the filter process was started. Because the step S30 and the following steps in FIG. 6 are repeated at an interval of 1 sec., step S208 adjusts the timing. When in step S208 the judgement is "NO", step S208 is repeated. When in step S208 the judgement is "YES", the flow proceeds to step S210.

In step S210, the electric current values $I_{LPF1}$, $I_{LPF2}$, and $I_{LPF3}$, which were obtained in steps S200, S204, and S206, are output to registers (not shown). When one of or both the electric current values $I_{LPF1}$, and $I_{LPF3}$ or the current values $I_{LPF2}$, and $I_{LPF3}$ are not obtained, "0" is output as the value. Thus, the filter process is completed.

Figure 8:
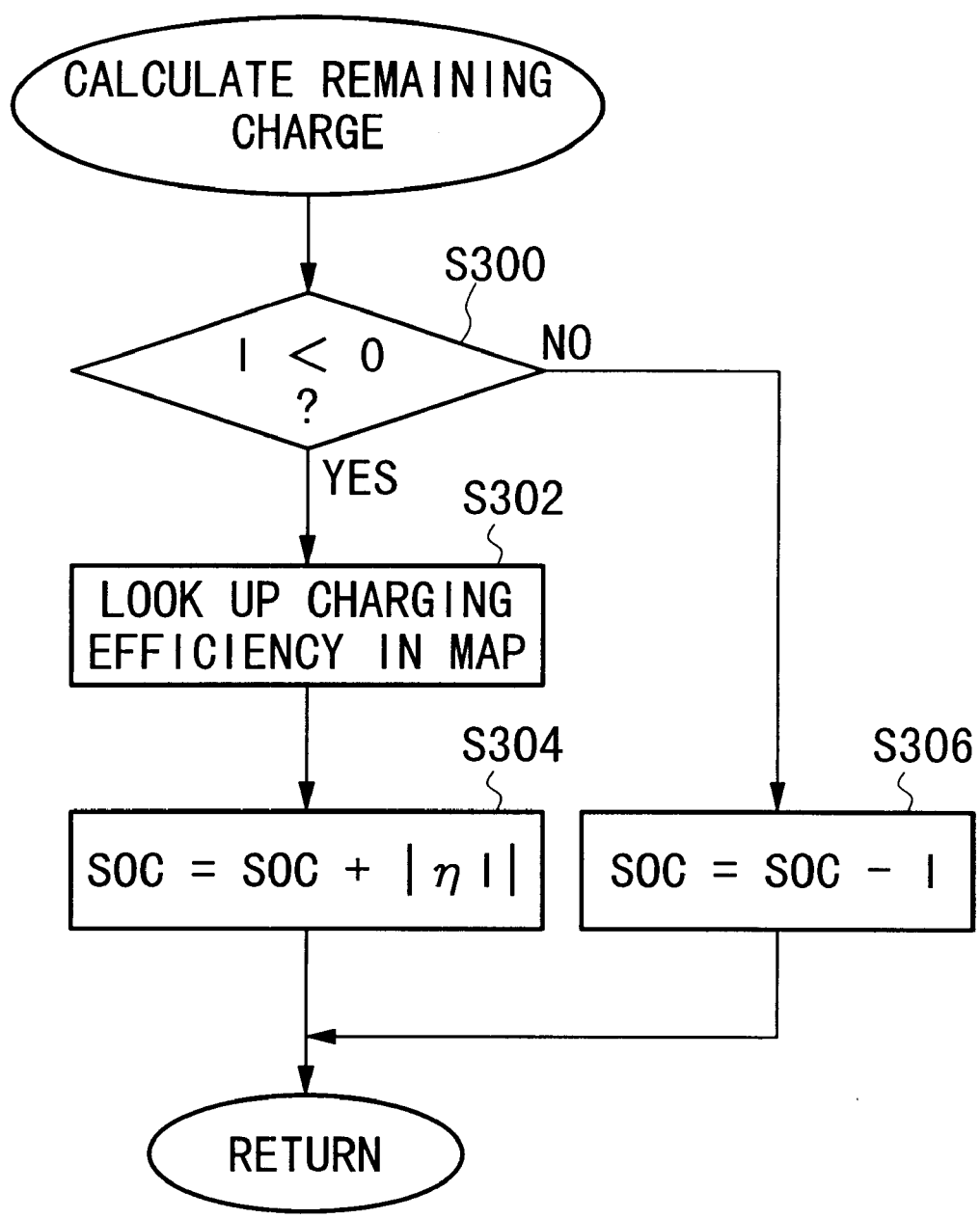
FIG. 8 is a flowchart showing the calculation of the remaining charge according to the present invention.

The process (step S30) for calculating the remaining charge, which is shown in FIG. 6, will be explained. FIG. 8 is a flowchart showing the procedure for calculating the remaining charge. This process is performed by the integrator 54 shown in FIG. 2. The process of step S30 is repeated at an interval of 1 sec.

When the calculation of the remaining charge is started, it is determined whether the input electric current value is negative or not (step S300). When the electric current is negative, the current flows into the battery 26. When the determination is "YES", the charging efficiency is looked up in the map (step S302). By this process, the remaining charge is accurately calculated, because while the charging of the battery is not always proportional to the electric current flowing into the battery 26, the charging efficiency depends on the battery temperature and the battery remaining charge.

Specifically, the present charging efficiency η is looked up in the charging efficiency map, based on the temperature of the sub-battery detected by the temperature detector 42 and the present remaining charge in the battery 26. The charging efficiency η should be based on the values output from the first-order lag filter 48, because it becomes more accurate than an efficiency based on the values directly output from the temperature detector 42. Since the battery 26 comprises ten sub-batteries, the charging efficiency η is calculated for each sub-battery.

When the process for calculating the charging efficiency η is completed, the electric current value output from the current detector 40 is multiplied by the obtained charging efficiency η, and the absolute value of the result is added to the present remaining charge (SOC: state of charge), to thereby obtain a new battery remaining charge. This process is performed for each of ten sub-batteries.

When in step S306 the determination is "NO", that is, when the electric current value detected by the current detector 40 is positive, the flow proceeds to step S306. When the electric current value is positive, the electric current is output from the battery 26.

In step S306, the electric current value, which was detected by the current detector 40, is subtracted from the present remaining charge to obtain a new remaining charge. This step is performed for each of ten sub-batteries.

When step S304 or S306 is completed, the flow returns to the main routine shown in FIG. 6.

When the process for calculating the remaining charge in step S40 is completed, the process for looking up the limit voltage for the remaining charge in the map is performed (step S40). This look-up is repeated at an interval of 1 sec.

Figure 9:
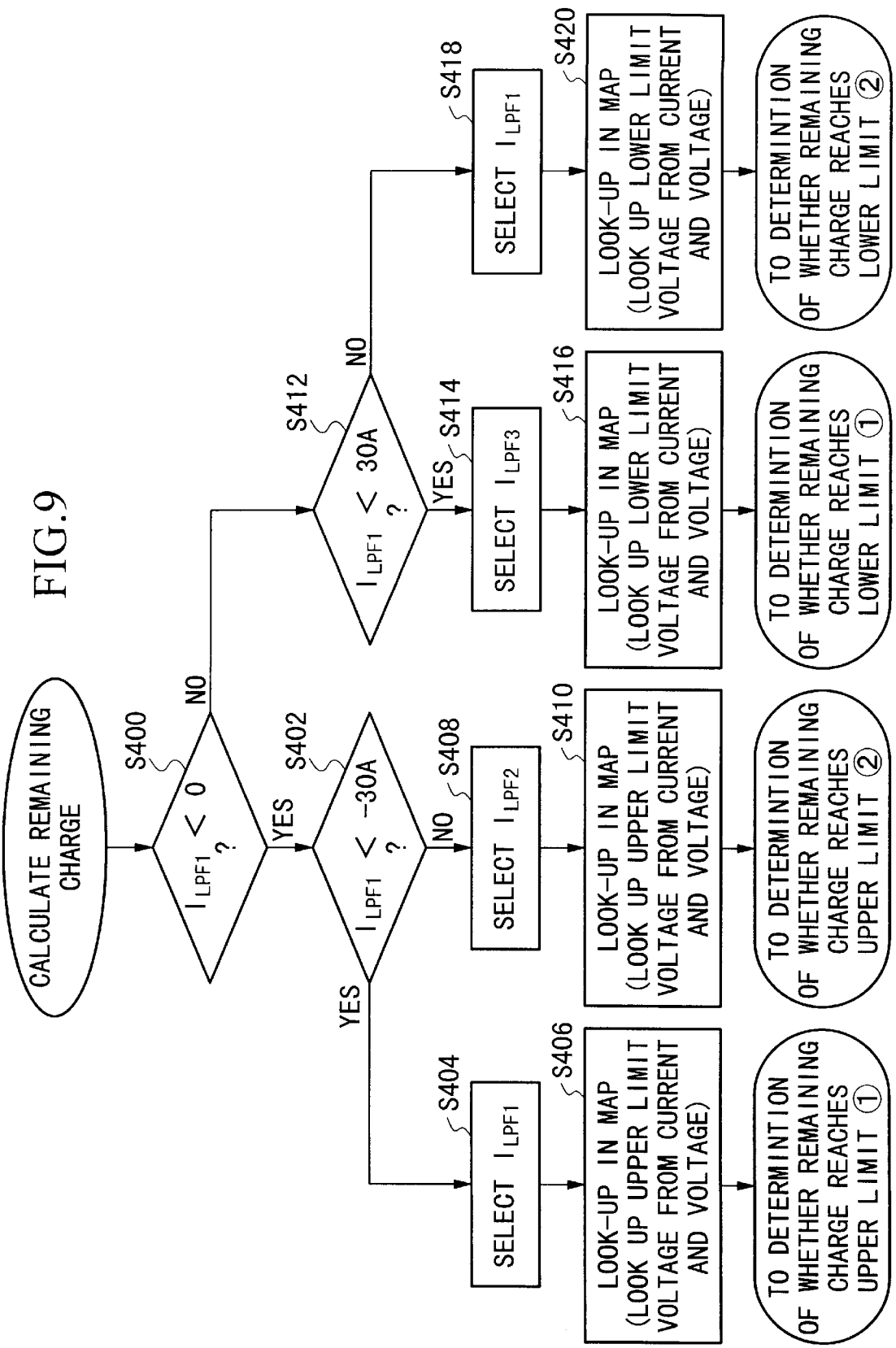
FIG. 9 is a flowchart showing the look-up of the limit voltage in the map according to the present invention.

FIG. 9 is a flowchart showing the process for looking up the limit voltage in the map. This process is performed with the map 56 for detecting the remaining charge in FIG. 2.

Once the look-up is started, it is determined whether the electric current value $I_{LPF1}$, which was output in step S210 in FIG. 7 and is stored in the register, is negative or not (step S400). That is, it is determined whether the electric current flows into the battery 26 or not. When the determination is "YES", the flow proceeds to step S402.

In step S402, it is determined whether the electric current value $I_{LPF1}$ is below −30 A or not. When the determination is "YES", the flow proceeds to step S404, where the electric current value $I_{LPF1}$ is selected from the electric current values $I_1$, $I_{LPF2}$, and $I_{LPF3}$.

Based on the electric current value $I_{LPF1}$ and the temperature output from the first-order lag filter 48, the voltage value (upper limit voltage) corresponding to the remaining charge of 80% of the sub-battery is obtained from the map 56 (step S406). The obtained upper limit voltage value is stored in the register not shown, and the flow returns to the main routine shown in FIG. 6. The process in step S406 is performed for each of the ten sub-batteries.

When in step S402 the determination is "NO", the flow proceeds to step S408, the electric current value $I_{LPF2}$ is selected from the electric current values $I_1$, $I_{LPF2}$, and $I_{LPF3}$.

Based on the electric current value $I_{LPF2}$ and the temperature output from the first-order lag filter 48, the voltage value (upper limit voltage) corresponding to the remaining charge of 80% of the sub-battery is obtained from the map 56 (step S410). The obtained upper limit voltage value is stored in the register not shown, and the flow returns to the main routine shown in FIG. 6. The process in step S410 is performed for each of the ten sub-batteries.

When in step S400 the determination is "NO", that is, when the electric current value $I_{LPF1}$ stored in the register is positive and the battery 26 discharges the electric current, the flow proceeds to step S412.

In step S412, it is determined whether the electric current value $I_{LPF1}$ is below 30 A or not. When this determination is "YES", the flow proceeds to step S414, where the electric current value $I_{LPF3}$ is selected from the electric current values $I_1$, $I_{LPF2}$, and $I_{LPF3}$. That is, because the rate of the change in the electric current value is small, the electric current value, which is calculated by the low-pass filter $I_{LPF3}$ with the small time constant, is selected.

Then, based on the electric current value $I_{LPF3}$ and the temperature output from the first-order lag filter 48, the voltage value (lower limit voltage) corresponding to the remaining charge of 20% of the sub-battery is obtained from the map 56 (step S416). The obtained lower limit voltage value is stored in the register not shown, and the flow returns to the main routine shown in FIG. 6. The process in step S416 is performed for each of the ten sub-batteries.

When in step S412 the determination is "NO", the flow proceeds to step S418, where the electric current value $I_{LPF1}$ is selected from the electric current values $I_1$, $I_{LPF2}$, and $I_{LPF3}$.

Based on the electric current value $I_{LPF1}$ and the temperature output from the first-order lag filter 48, the voltage value (lower limit voltage) corresponding to the remaining charge of 20% of the sub-battery is obtained from the map 56 (step S420). The obtained lower limit voltage value is stored in the register not shown, and the flow returns to the main routine shown in FIG. 6. The process in step S420 is performed for each of the ten sub-batteries.

At least one of the steps S406, S410, S416, and S420, shown in FIG. 9, is completed, at which point the process for determining whether the remaining charge reaches the upper or lower limit (step S50). This process is repeated by the comparator 58 and the corrector 60 in FIG. 2 at an interval of 1 sec.

Figure 10:
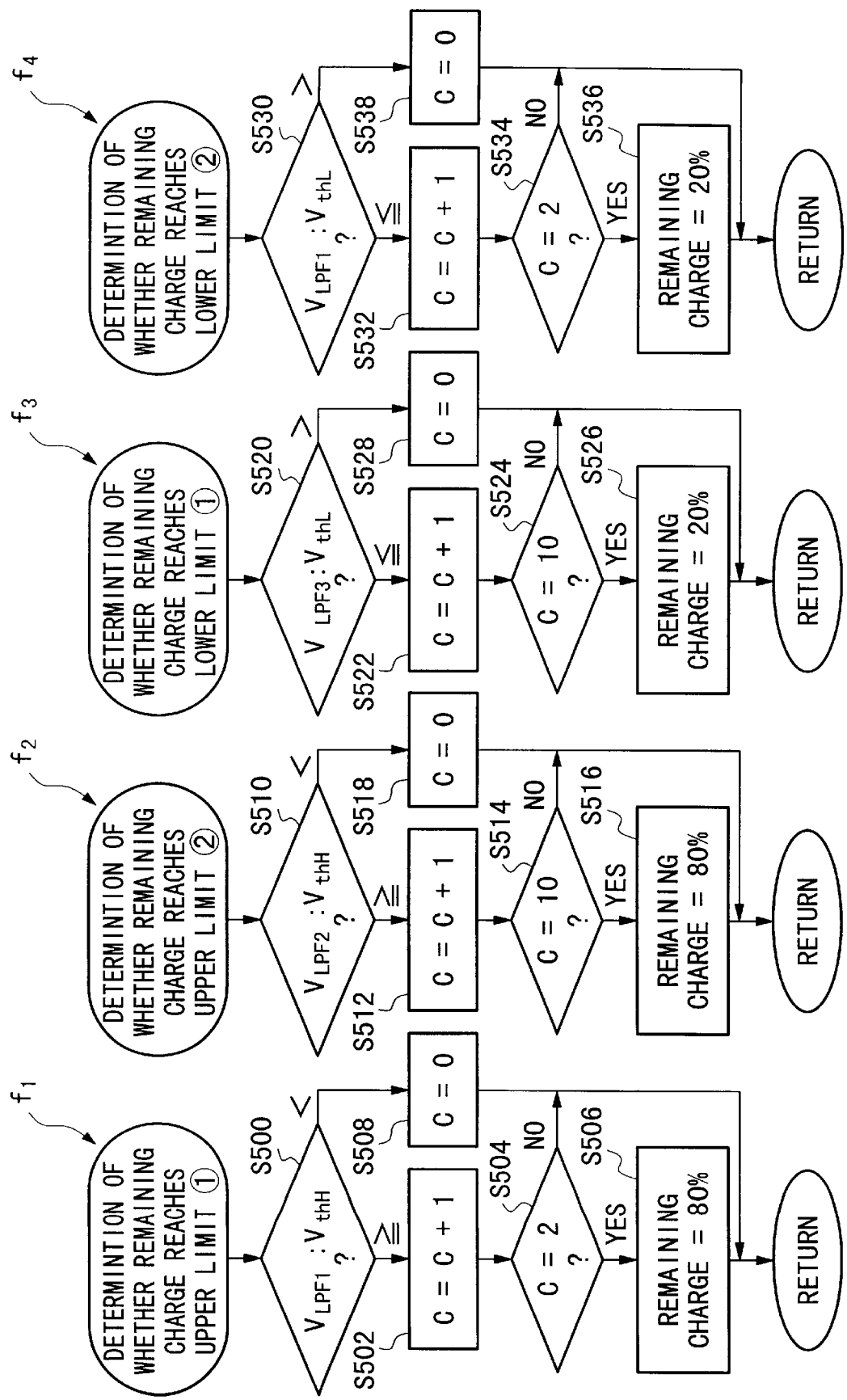
FIG. 10 is a flowchart showing the determination of whether the remaining charge has reached the upper or lower limit.

FIG. 10 is a flowchart showing the procedure for determining whether the remaining charge had reached the upper or lower limit.

While FIG. 10 shows four flowcharts, one of the flowcharts is selected depending on the result of the look-up of the limit voltage for the remaining charge in the map in FIG. 9. That is, the process of the flowchart $f_1$ in FIG. 10 follows step S406 in FIG. 9, the process of the flowchart $f_2$ in FIG. 10 follows step S410 in FIG. 9, the process of the flowchart $f_3$ in FIG. 10 follows step S416 in FIG. 9, and the process of the flowchart $f_4$ in FIG. 10 follows step S420 in FIG. 9.

Reference character "C" in FIG. 10 indicates a counter value for setting the remaining charge of sub-battery accurately to 80% or 20%. The voltage value output from the first-order lag filter 50 varies as time passes. For instance, once the remaining charge exceeds the upper voltage value $V_{thH}$, the voltage may often drop immediately. The remaining charge in the battery 26 is not immediately set to 80% the instant that the voltage value output from the first-order lag filter 50 exceeds the upper voltage value $V_{thH}$. The remaining charge in the battery 26 is then set to 80% only after the voltage value from the first-order lag filter 50 has been continuously above the upper voltage value $V_{thH}$ for a predetermined time, and thereby improving the accuracy of the detection of the remaining charge.

First, the process of the flowchart $f_1$ will be explained. Once the process is started, the voltage value $V_{LPF1}$ output from the first-order lag filter 50 is compared with the upper limit voltage value $V_{thH}$ obtained in step S406 in FIG. 9 (step S500). This process is performed for each of the voltage values output from the sub-batteries. In step S500, when the one of the voltage values $V_{LPF1}$ from the sub-batteries is above the upper limit voltage value $V_{thH}$, the flow proceeds to step S502.

In step S502, the counter value C, which is initially zero, is incremented. In step S504, it is determined whether the counter value is 2 or not. When in step S504 the determination is "YES", the flow proceeds to step S506, where the remaining charge in the battery 26 is set to 80% (the reset process is performed).

When in step S500 all of the voltage values $V_{LPF1}$ of the sub-batteries are below the upper limit voltage value $V_{thH}$, the flow proceeds to step S508, where the counter value C is set to 0.

When the process in step S506 or S508 is completed, or when in step S504 the determination is "NO", the remaining charge is equal to or below 80%. Then, the integrated value from the integrator 54 is used as the remaining charge in the battery 26, the remaining charge is not reset, and the flow returns the main routine in FIG. 6.

The process of the flowchart $f_2$ will now be explained. Once the process is started, the voltage value $V_{LPF2}$ output from the first-order lag filter 50 is compared with the upper limit voltage value $V_{thH}$ obtained in step S410 in FIG. 9 (step S510). Here, referring to FIG. 2, the time constant changer 52 changes the time constant of the first-order lag filter 50, and the voltage value is obtained by the filter process with the time constant which varies depending on the rate of change in the voltage in a manner similar to the process for the currents. This process is performed for each of the voltage values output from the sub-batteries. In step S510, when one of the voltage values $V_{LPF2}$ from the sub-batteries is above the upper limit voltage value $V_{thH}$, the flow proceeds to step S512.

In step S512, the counter value C, which is initially zero, is incremented. In step S514, it is determined whether the counter value is 10 or not. While in the flowchart $f_1$ it is determined whether the counter value C is 2 or not, it is determined in the flowchart $f_2$ whether the counter value C is 10 which is greater than 2. The reason for this is that, because the rate of change in the electric current value $I_{LPF1}$ is small in step S402 in FIG. 9, the rate of charging of the battery 26 in a unit of time is small, and it is accurately detected that the remaining charge in the battery 26 has reached 80%.

When in step S514 the determination is "YES", the flow proceeds to step S516, where the remaining charge in the battery 26 is set to 80% (the reset process is performed).

When in step S510 all of the voltage values $V_{LPF2}$ of the sub-batteries are below the upper limit voltage value $V_{thH}$, the flow proceeds to step S518, where the counter value C is set to 0.

When the process in step S516 or S518 is completed, or when in step S514 the determination is "NO", the remaining charge is equal to or below 80%. Then, the integrated value from the integrator 54 is used as the remaining charge in the battery 26, the remaining charge is not reset, and the flow returns the main routine in FIG. 6.

The process of the flowchart $f_3$ will now be explained. Once the process has started, the voltage value $V_{LPF3}$ output from the first-order lag filter 50 is compared with the lower limit voltage value $V_{thL}$ obtained in step S410 in FIG. 9 (step S520). This process is performed for each of the voltage values output from the sub-batteries. In step S520, when one of the voltage values $V_{LPF3}$ from the sub-batteries is below the lower limit voltage value $V_{thL}$, the flow proceeds to step S522.

In step S522, the counter value C, which is initially zero, is incremented. In step S524, it is determined whether the counter value is 10 or not. The reason for this is the same as that explained regarding the flowchart $f_2$.

When in step S524 the determination is "YES", the flow proceeds to step S526, where the remaining charge in the battery 26 is set to 20% (the reset process is performed).

When in step S520 all of the voltage values $V_{LPF3}$ of the sub-batteries are above the lower limit voltage value $V_{thL}$, the flow proceeds to step S528, where the counter value C is set to 0.

When the process in step S526 or S528 is completed, or when in step S524 the determination is "NO", the remaining charge is equal to or above 20%. Then, the integrated value from the integrator 54 is used as the remaining charge in the battery 26, the remaining charge is not reset, and the flow returns the main routine in FIG. 6.

The process of the flowchart $f_4$ will here be explained. Once the process is started, the voltage value $V_{LPF1}$ output from the first-order lag filter 50 is compared with the lower limit voltage value $V_{thL}$ obtained in step S410 in FIG. 9 (step S530). This process is performed for each of the voltage values output from the sub-batteries. In step S530, when one of the voltage values $V_{LPF1}$ from the sub-batteries is below the lower limit voltage value $V_{thL}$, the flow proceeds to step S532.

In step S532, the counter value C, which is initially zero, is incremented. In step S534, it is determined whether the counter value is 2 or not. The reason for the comparison of the counter value with 2 is that, because the absolute value in step S412 in FIG. 9 is high, the rate of charging of the battery 26 in a unit of time is high.

When in step S534 the determination is "YES", the flow proceeds to step S536, where the remaining charge in the battery 26 is set to 20% (the reset process is performed).

When in step S530 all of the voltage values $V_{LPF3}$ of the sub-batteries are above the lower limit voltage value $V_{thL}$, the flow proceeds to step S538, where the counter value C is set to 0.

When the process in step S536 or S538 is completed, or when in step S534 the determination is "NO", the remaining charge is equal to or above 20%. Then, the integrated value from the integrator 54 is used as the remaining charge in the battery 26, the remaining charge is not reset, and the flow returns the main routine in FIG. 6.

The flow proceeds to step S60 to judge the deterioration of the battery. The step S60 is repeated at an interval of 1 sec.

Figure 11:
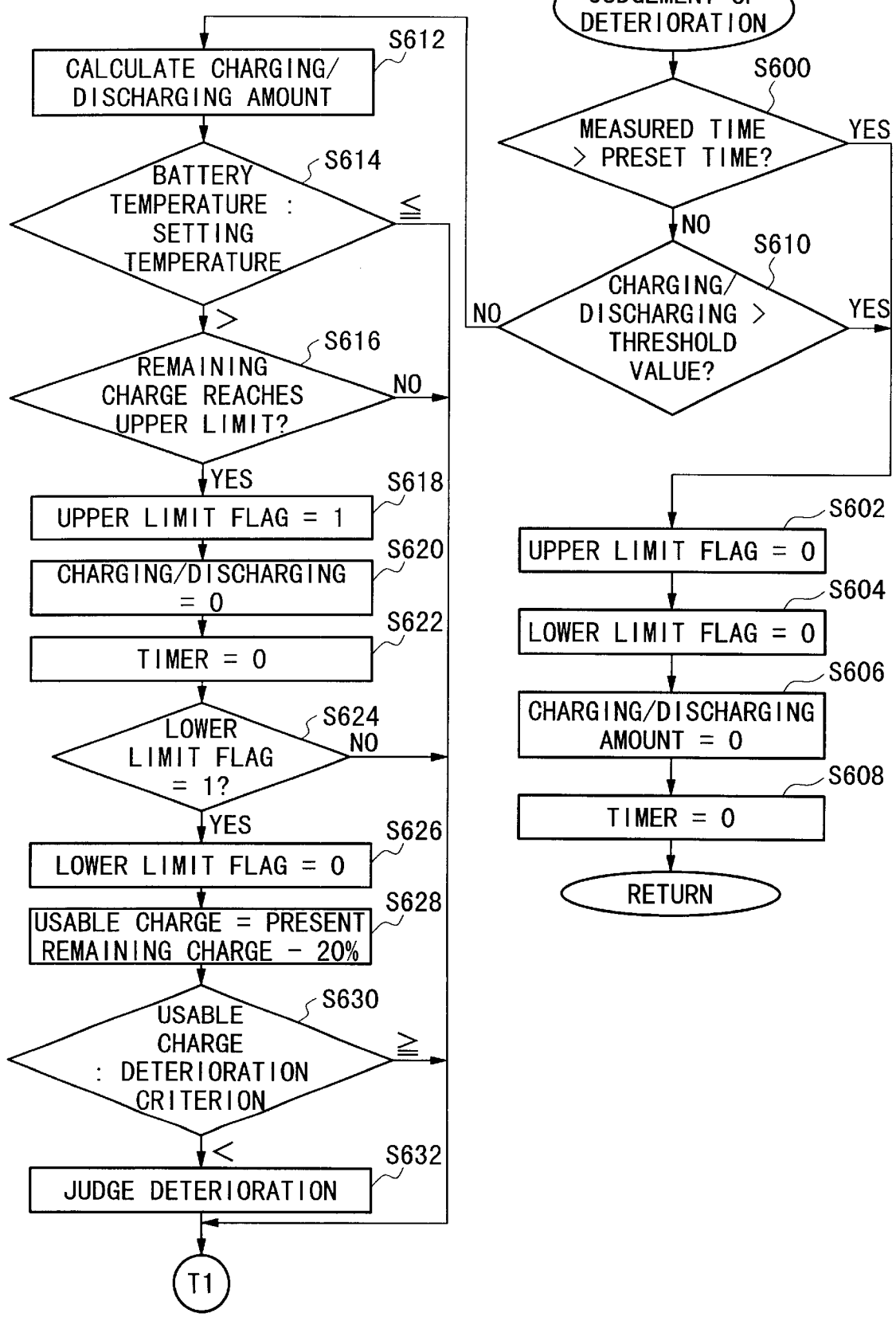
FIG. 11 is a flowchart showing the judgement of the deterioration of the present invention.
Figure 12:
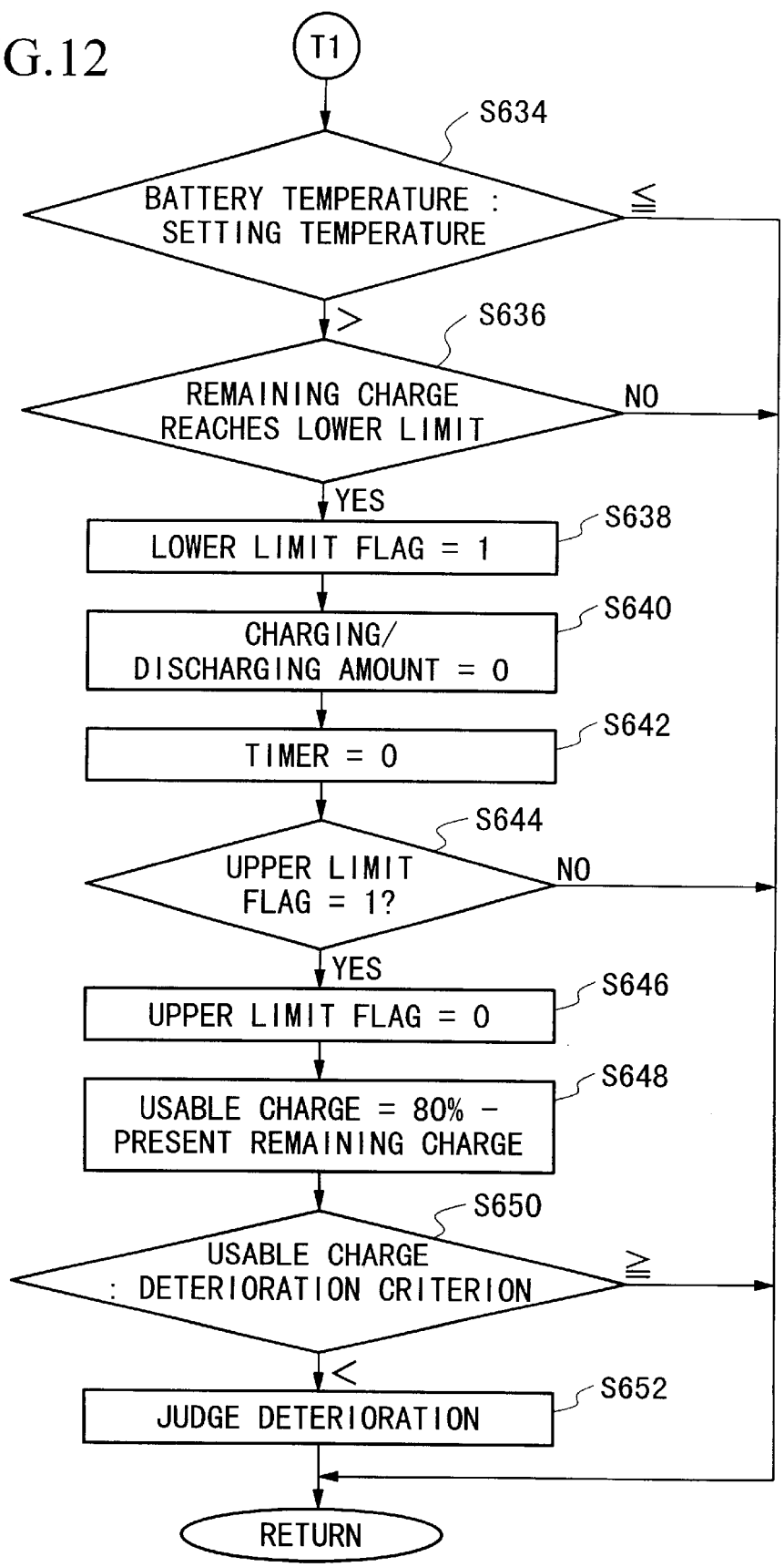
FIG. 12 is a flowchart showing the judgement of the deterioration of the present invention.

FIGS. 11 and 12 are flowcharts showing the procedure of judging the deterioration of the battery.

In the following description, it is assumed that the deterioration judgement prohibition condition setter 64 has preset the charging/discharging threshold value, the setting time, and the setting temperature as the conditions for prohibiting the judgement of the deterioration. The processes shown in FIGS. 11 and 12 are performed by the deterioration judgement device 62 shown in FIG. 2. The deterioration judgement device 62 includes registers for storing the values of various flags which are described later, of which initial values are set to be zero.

When the deterioration judgement process is commenced, it is determined whether the measured time is longer than the setting time preset by the deterioration judgement prohibition condition setter 64 (step S600). When the determination is "YES", an upper limit flag, a lower limit flag, a charging/discharging amount, and a timer are set to zero in steps S602, S604, S606, and S608.

The upper limit flag becomes 1 when the voltage output from the sub-battery has reached the upper voltage and the remaining charge in the battery has reached 80%, that is, when step S506 or S516 is performed. The lower limit flag becomes 1 when the remaining charge in the battery has reached 20%, that is, when step S526 or S536 shown in FIG. 10 is performed.

Here, the charging/discharging amount is obtained by adding the absolute value of the electric current irrespective of charging and discharging (without consideration of symbol + or −), although the remaining charge calculated in FIG. 8 is obtained by the integration taking into consideration charging and discharging, that is, symbol + or −. The timer measures the time.

When the step S608 is completed, the flow returns to the main routine in FIG. 6.

The processes in the steps S600 to S608 prohibits judging the deterioration when the time required for the measured voltage to reach the upper or lower voltage value is longer than the preset time.

When in step S600 the determination is "NO", that is, when the preset time has not passed, the flow proceeds to step S610. In step S610, it is determined whether the charging/discharging amount exceeds the charging/discharging threshold value or not. When this determination is "YES", the above-described steps S602 to S608 are performed. That is, when the charging/discharging amount exceeds the charging/discharging threshold value, the judgement of the deterioration is prohibited. The process in step S610 prohibits the judgement of the deterioration when the charging/discharging amount is high.

On the other hand, when in step S610 the determination is "NO", that is, when the charging/discharging amount is equal to or below the charging/discharging threshold value, the flow proceeds to step S612, in which the charging/discharging amount is calculated by the integrator 54. This process, as described above, calculates the charging/discharging amount, based on not only the charging amount but also the discharging amount.

The following process is roughly divided into two parts. One part is a process for obtaining the actual available remaining charge (usable charge) by step S612 of calculating the charging/discharging amount once the remaining charge had reached the upper limit (80%) until the remaining charge has reached to the lower limit (20%). The other part is a process for obtaining the actual available remaining charge (usable charge) by step S612 of calculating the charging/discharging amount once the remaining charge had reached the lower limit (20%) until the remaining charge has reached the upper limit (80%).

In the following description, the two processes are explained as sequences of function. As described above, when the measured time is longer, the judgement of the battery deterioration is prohibited in step S600. When the charging/discharging amount is high, the judgement of the battery deterioration is prohibited in step S610. Further, when the temperature of the battery is low, the judgement of the battery deterioration is prohibited in step S614. Similarly, the judgement of the battery deterioration is prohibited in step S634 when the battery temperature is low. In the following, the description of these processes is not repeated.

First, the process for obtaining the actual available remaining charge (usable charge) by step S612 of calculating the charging/discharging amount once the remaining charge in the battery 26 has reached the upper limit (80%) until the remaining charge decreases to the lower limit (20%) will be explained.

When the remaining charge in the battery 26 has reached the upper limit (80%), the determination in the step S616 becomes "YES." The detail of the process for calculating this upper limit is shown in FIG. 9 and in the flowcharts $f_1$ and $f_2$ in FIG. 10.

When in step S616 the determination is "YES", the flow proceeds to step S618, where the upper limit flag is set to be 1, and then in step S622 the value for the timer is set to be 0. Because the remaining charge reaches the upper limit (80%), the initialization is performed in the steps S618 to S622 in order to start the calculation of the charge until the remaining charge decreases to the lower limit (20%).

After step S622, the flow proceeds to step S624, where it is determined whether the lower limit flag is 1 or not. Because in this situation the remaining charge has just reached the upper limit, the determination in step S624 is naturally "NO." When in step S624 the determination is "NO", the flow proceeds through step S634 to step S636. In step S636, it is determined whether the remaining charge has reached the lower limit (20%) or not. The detail of the process for the determination of whether the remaining charge has reached the lower limit (20%) is shown in FIG. 9 and the flowcharts $f_3$ and $f_4$ in FIG. 10.

When in step S636 the determination is "NO", the flow returns to the main routine shown in FIG. 6.

When 1 sec. has passed after the completion of the step S60 shown in FIG. 6, the step S60 is commenced again. The steps S30 to S50 are repeated at an interval of 1 sec.

When the judgement of the deterioration is performed again, the process is started from the step S600, and proceeds through the step S610 to the step S612, where the charging/discharging amount is calculated. When the upper limit flag is 1 and the remaining charge has not reached the lower limit, the charging/discharging amount is calculated in step S612, the determination in step S636 is "NO", the flow returns to the main routine, and these steps are repeated. By the repetition of the steps, the charging/discharging amount is integrated.

Next, the operation of this invention when the discharging of the battery 26 increases and the remaining charge has reached 20% will be explained.

When the process for judging the deterioration shown in FIG. 11 is started again, the flow proceeds through steps S600, S610, S612, . . . to step S624. Because, at this point, the upper limit flag is 1 and the lower limit flag is 0, the determination becomes "NO" in step S624, and then the flow proceeds through step S634 to step S636. In step S636, it is determined whether the remaining charge reaches the lower limit (20%) or not. When the remaining charge has reached the lower limit, the determination is "YES", and the flow proceeds to step S638. In step S638, the lower limit flag is set to be 1, the charging/discharging amount is set to be 0 in step S640, and the timer value is set to be 0 in step S642. When the charging/discharging amount is set to be 0 in step S640, the previous charging/discharging amount is stored in the register. In this situation, the upper limit flag and the lower limit flag are 1.

In step S644, it is determined whether the upper limit flag is 1 or not. Because in this situation both the upper and lower limit flags are 1, the determination in step S644 is "YES", and in step S646 the upper flag is set to be 0. Then, the upper limit flag is 0, and the lower limit flag is 1.

In step S648, the usable charge is calculated. In this process, the present remaining charge which was obtained in FIG. 8 is subtracted from the charge corresponding to the upper limit of 80% at which the remaining charge was corrected, to thereby obtain the usable charge of the battery.

Figure 13A:
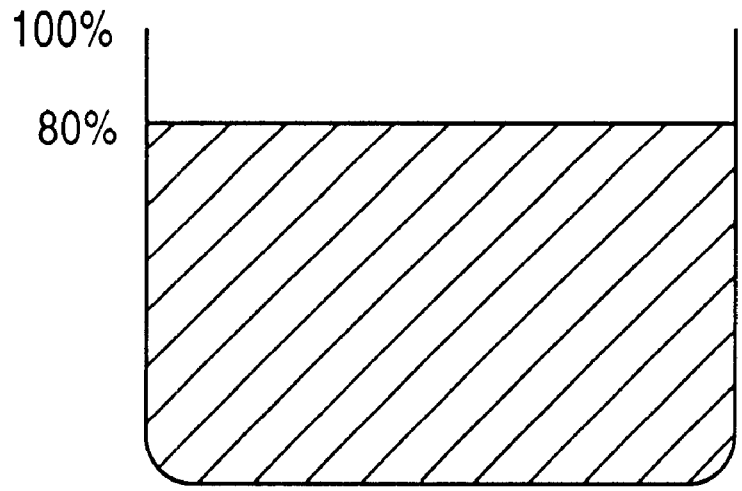
FIGS. 13A and 13B are diagrams for explaining the deterioration of the battery.
Figure 13B:
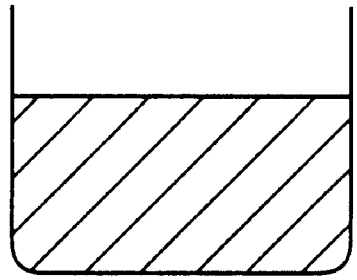

General batteries (which are new and do not deteriorate) have the usable capacities corresponding to 80%–20%=60% between the lower limit (20%) and the upper limit (80%). However, because, the maximum capacities are reduced (the deteriorated state as described in FIG. 13) as the batteries deteriorate, the usable capacities between the upper and lower limits are also reduced.

When in step S650 the usable capacity, which is expected to be 60% when the battery is new, decreases below 30%, which is the deterioration criterion, it is judged in step S652 that the battery is deteriorating.

On the other hand, when in step S650 the usable capacity is equal to or above the deterioration criterion, the flow returns to the main routine.

Next, the operation of the invention to obtain the actual available remaining charge (usable charge) by step S612 of calculating the charging/discharging amount once the remaining charge in the battery 26 had reached the lower limit (20%) until the remaining charge has reached the upper limit (80%) will be explained.

When the remaining charge in the battery 26 decreases to the lower limit (20%), the determination in step S636 becomes "YES". The detail of the process for calculating the lower limit is shown in FIG. 9 and the flowcharts $f_3$ and $f_4$ in FIG. 10.

When in step S636 the determination is "YES", the flow proceeds to step S638. In step S638 the lower limit flag is set to be 1, in step S640 the charging/discharging amount is set to be 0, and in step S642 the timer value is set to be 0. That is, because the remaining charge reaches the lower limit (20%), the initialization is performed in the steps S638 to S642 in order to start the calculation of the charge until the remaining charge increases to the upper limit (80%).

After step S642, the flow proceeds to step S644, where it is determined whether the upper limit flag is 1 or not. Because in this situation the remaining charge has just reached the lower limit, the determination in step S644 is naturally "NO." When in step S644 the determination is "NO", the flow returns to the main routine. The detail of the process for determining whether the remaining charge has reached the upper limit (80%) is shown in FIG. 9 and the flowcharts $f_1$ and $f_2$ in FIG. 10.

When 1 sec. has passed after step S60 in FIG. 6, the process of step S60 is started again. The processes of steps S30 to S50 are repeated at an interval of 1 sec.

When the deterioration had been judged again, the process is commenced from step S600, the flow proceeds through step S610 to step S612, in which the charging/discharging amount is calculated. When the lower limit flag is 1 and the remaining charge in the battery 26 does not reach the upper limit, the charging/discharging amount is calculated in step S612, the determination in step S616 is "NO", the determination in step S646 is "NO", the flow returns to the main routine shown in FIG. 6, and these steps are repeated. By the repetition of the steps, the charging/discharging amount is integrated.

Thus, the usable capacity is obtained and is compared with the deterioration criterion, and then it is determined whether the battery is deteriorating or not.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An apparatus for judging deterioration of a battery, comprising:
   current detector for detecting output electric current from and regenerative electric current to said battery;
   voltage detector for detecting a voltage output from said battery;
   integrator for calculating a remaining charge in said battery by integrating the result of detection by said current detector;
   threshold voltage calculator for calculating a first judgment voltage corresponding to a battery voltage when the remaining charge in said battery indicates a first value, and a second judgment voltage corresponding to a battery voltage when the remaining charge in said battery indicates a second value, based on the electric current value filtered by said filter;
   comparator for comparing the first and second judgment voltage, calculated by said threshold voltage calculator, with the output voltage value from said battery;
   corrector for correcting the remaining charge to said first or second value when the output voltage value has reached said first and second judgment voltage;
   current integrator for integrating the output current from the battery and the regenerative current after the remaining charge was corrected to said first value until the remaining charge is corrected to said second value; and a deterioration judgment device for judging the deterioration of said battery when the value obtained from the integration by said current integrator is equal to or below a predetermined deterioration criterion.

2. An apparatus according to claim 1, further comprising:

temperature detector for detecting the temperature of said battery; and battery deterioration judgement prohibition device for prohibiting the judgement of the deterioration of said battery when the temperature detected by said temperature detector is below a preset temperature, when the time for the integration by said current integrator is longer than a predetermined time, or when the charging/discharging current is above a charging/discharging threshold value.

* * * * *